United States Patent
Mikawa et al.

(10) Patent No.: US 7,304,341 B2
(45) Date of Patent: Dec. 4, 2007

(54) SEMICONDUCTOR DEVICE AND METHOD FOR FABRICATING THE SAME

(75) Inventors: Takumi Mikawa, Shiga (JP); Toru Nasu, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/415,069

(22) Filed: May 2, 2006

(65) Prior Publication Data
US 2006/0292816 A1  Dec. 28, 2006

(30) Foreign Application Priority Data
Jun. 24, 2005 (JP) ............................ 2005-185314

(51) Int. Cl.
H01L 27/108 (2006.01)
H01L 29/76 (2006.01)
H01L 29/94 (2006.01)
H01L 31/119 (2006.01)

(52) U.S. Cl. ................. 257/296; 257/303; 257/306; 257/E27.086; 257/E27.087; 257/E27.088

(58) Field of Classification Search ............... 257/296, 257/303, 304, 306, 310, E27.086, E27.087, 257/E27.088
See application file for complete search history.

(56) References Cited

U.S. PATENT DOCUMENTS
7,102,875 B2 * 9/2006 Lee et al. ................... 361/312

FOREIGN PATENT DOCUMENTS
JP 2003-007859 A 1/2003
JP 2005-142541 A 6/2005

* cited by examiner

Primary Examiner—Hoai V Pham
(74) Attorney, Agent, or Firm—McDermott Will & Emery LLP

(57) ABSTRACT

A semiconductor device comprises: an insulating film formed over a semiconductor substrate and having a first recess; a plurality of capacitor elements each of which is composed of a capacitor lower electrode formed on wall and bottom portions of the first recess and having a second recess, a capacitor insulating film of a dielectric film formed on wall and bottom portions of the second recess and having a third recess, and a capacitor upper electrode formed on wall and bottom portions of the third recess; and a conductive layer (referred hereinafter to as a low-resistance conductive layer) which is formed to cover at least portions of the respective capacitor upper electrodes constituting the plurality of capacitor elements and to extend across the plurality of capacitor elements and which has a lower resistance than the capacitor upper electrode.

5 Claims, 10 Drawing Sheets

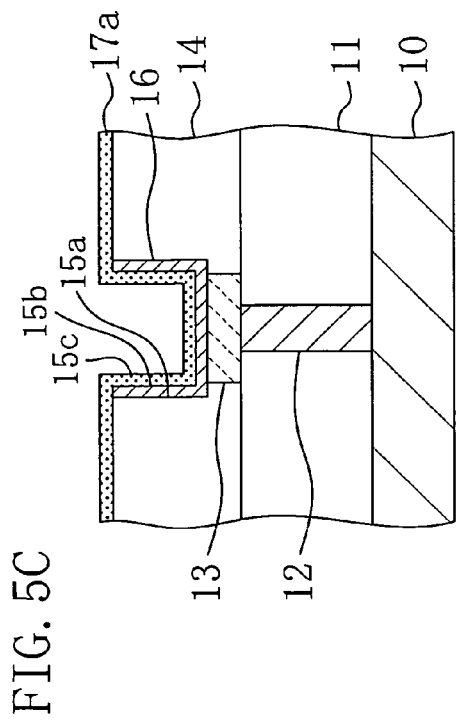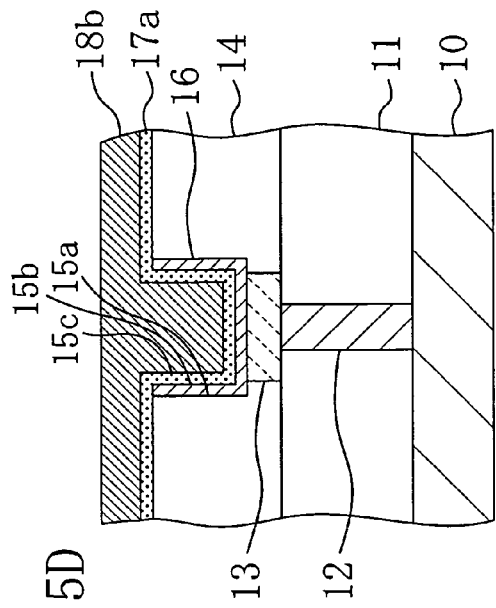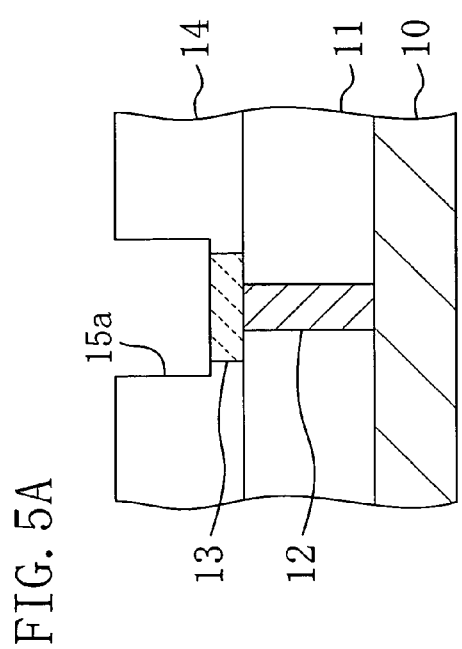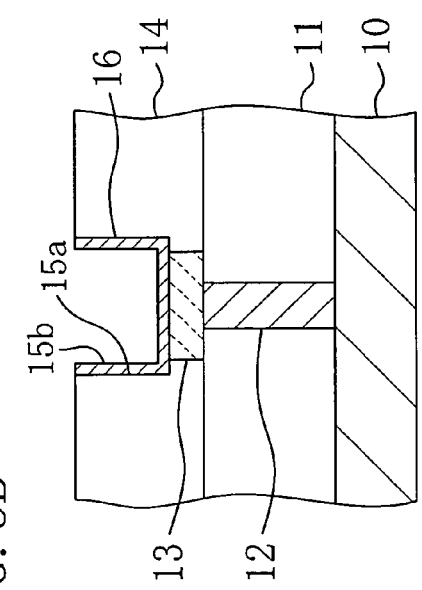
FIG. 5A
FIG. 5B
FIG. 5C
FIG. 5D

SEMICONDUCTOR DEVICE AND METHOD FOR FABRICATING THE SAME

CROSS-REFERENCE TO RELATED APPLICATIONS

This application claims priority under 35 U.S.C. § 119 on Patent Application No. 2005-185314 filed in Japan on Jun. 24, 2005, the entire contents of which are hereby incorporated by reference.

BACKGROUND OF THE INVENTION (a) Fields of the Invention

The present invention relates to semiconductor devices which are provided with capacitor elements of three-dimensionally stacked structures employing dielectric films of dielectric materials as capacitor insulating films, and to methods for fabricating such devices.

(b) Description of Related Art

In development of ferroelectric memory devices, those of planar structures having small capacities of 1 to 64 kbit start being produced in volume. Recently, the center of development of the ferroelectric memory devices has been shifting to those of stack structures having large capacities of 256 kbit to 4 Mbit. In the ferroelectric memory devices of stack structures, a contact plug electrically connected to a semiconductor substrate is arranged immediately below a capacitor lower electrode, which reduces their cell sizes to improve their packing densities.

The trend in the ferroelectric memory devices toward miniaturization will advance in the future. With this advancement, it becomes difficult for flat-type capacitor elements to secure the quantity of electric charge necessary for memory operation, so that capacitor elements of three-dimensionally stacked structures are required which include so-called three-dimensional capacitor elements. In order to realize the capacitor elements of three-dimensionally stacked structures, it is necessary to form a dielectric film and a capacitor upper electrode with good coverage on a capacitor lower electrode of an increased surface area having the shape of a step. Conventionally, the capacitor lower electrode, the dielectric film, and the capacitor upper electrode are formed in a concave hole using a CVD method, thereby realizing the capacitor element of a three-dimensionally stacked structure (see, for example, Japanese Unexamined Patent Publication No. 2003-7859 (page 8 and FIG. 5)).

Hereinafter, the structure of a conventional semiconductor device of a three-dimensionally stacked structure having a capacitor element will be described with reference to FIG. 10.

Referring to FIG. 10, on a semiconductor substrate 100, a first interlayer insulating film 103 is formed which is composed of an oxide film 101 and a first anti-reflection film 102 of a nitride film (a SiON film). A polysilicon film 104 and first and second barrier metal films 105 and 106 are disposed in the first interlayer insulating film 103. The polysilicon film 104 is formed in a lower portion of a storage contact hole reaching an active region (not shown) of the semiconductor substrate 100, and the first and second barrier metal films 105 and 106 are formed on the polysilicon film 104 and in an upper portion of the storage contact hole. The polysilicon film 104 is formed by a chemical vapor deposition method (a CVD method). During a high-temperature thermal treatment in an oxygen atmosphere, oxygen diffuses through a storage electrode to induce oxidation of polysilicon at the interface between a polysilicon plug of the polysilicon film 104 and the storage electrode. The first and second barrier metal films 105 and 106 serve to prevent this induction.

On the first interlayer insulating film 103, a second interlayer insulating film 110 is formed which is made of an etch stop film 107, an oxide film 108, and a second anti-reflection film 109. A capacitor lower electrode 111, a first BST thin film 112, a second BST thin film 113, and a capacitor upper electrode 114 are sequentially disposed in the second interlayer insulating film 110. The capacitor lower electrode 111 with a thickness of 5 to 50 nm is formed in a storage node hole by a CVD method. The first BST thin film 112 is formed by an ALD (atomic layer deposition) method. The second BST thin film 113 is formed by a CVD method. The capacitor upper electrode 114 is formed by a CVD method or a sputtering method. Note that the capacitor upper electrode 114 and the capacitor lower electrode 111 constitute a storage electrode.

As shown above, the conventional semiconductor device includes the capacitor element having the three-dimensionally stacked structure of a concave-shaped three-dimensional configuration, thereby realizing a miniaturized, highly-integrated dielectric memory device.

SUMMARY OF THE INVENTION

In the conventional example described above, when a thermal treatment is performed for crystallization of the dielectric film forming the first and second BST thin films 112 and 113, a problem arises that in a portion of the capacitor upper electrode 114 located around the bottom of the concave hole and having the worst step coverage, the upper electrode 114 becomes broken depending on the selected material thereof. In addition, the capacitor upper electrode 114 is made of a platinum film for the reason that the platinum film has a good compatibility with a dielectric film such as the first and second BST films 112 and 113, and a high ductility of the capacitor upper electrode 114 made of a platinum film in turn facilitates stress migration. From this, it is obvious that such a thermal stress migration causes a high incidence of breaks in the capacitor upper electrode 114.

The first and second BST films 112 and 113 that are high dielectric films have crystallization temperatures of 500 to 700° C., which fall within the group with a relatively low crystallization temperature. However, some ferroelectric films have crystallization temperatures reaching as high as 800° C., as typified by an SBT film as a ferroelectric film. From this fact, it is conceivable that if the rise in the crystallization temperature and the long-time consumption of the crystallization proceed, the probability of causing failures such as breaks extremely rises.

For an alternative electrode material, a study is made of the use of an oxide material such as $IrO_x$ or $RuO_x$ that is more resistant to stress migration than pure metal. Since such an oxide material is unreactive during crystallization of a high dielectric film or a ferroelectric film, it is desirable from this point to use the oxide material as an electrode material forming a capacitor provided within the concave hole.

However, the resistance of the oxide material is higher than that of a metal material. In particular, since the capacitor upper electrode functions as a cell plate of the dielectric memory device, the resistance of the material forming the capacitor upper electrode affects cell plate operation. That is to say, if a material of higher resistance is chosen as an oxide material for the capacitor upper electrode, interconnect delay in which start-up delays at the time of driving the cell plate occurs to hamper quick operation of a memory cell.

In view of the foregoing, an object of the present invention is to provide a highly-integrated, quickly operable dielectric memory device of a three-dimensionally stacked structure which prevents interconnect delay of a cell plate of a capacitor upper electrode without depending on the material for a dielectric material and the material for a capacitor upper electrode.

To attain the above object, a semiconductor device according to one aspect of the present invention comprises: an insulating film formed over a semiconductor substrate and having a first recess; a plurality of capacitor elements each of which is composed of a capacitor lower electrode, a capacitor insulating film, and a capacitor upper electrode, the capacitor lower electrode being formed on wall and bottom portions of the first recess and having a second recess, the capacitor insulating film of a dielectric film being formed on wall and bottom portions of the second recess and having a third recess, the capacitor upper electrode being formed on wall and bottom portions of the third recess; and a conductive layer (referred hereinafter to as a low-resistance conductive layer) which is formed to cover at least portions of the respective capacitor upper electrodes constituting the plurality of capacitor elements and to extend across the plurality of capacitor elements and which has a lower resistance than the capacitor upper electrode.

With the semiconductor device according to one aspect of the present invention, the low-resistance conductive layer is provided on the top of the capacitor upper electrode. Thus, even though the material of high resistivity such as an oxide is used as an electrode material for the capacitor upper electrode for the purpose of preventing breaks due to stress migration during a thermal treatment, start-up at the time of driving a cell plate can be prevented from delaying, thereby avoiding interconnect delay. Consequently, a capacitor element having a cell structure with no interconnect delay caused therein can be realized without depending on the material for the dielectric film and the material for the capacitor upper electrode, so that a semiconductor device capable of having a high packing density can be provided.

Preferably, in the semiconductor device according to one aspect of the present invention, the capacitor upper electrode is formed to be embedded within the third recess.

With this device, the capacitor upper electrode has no bending portion within the third recess. Therefore, not only the effects described above but also a highly-integrated semiconductor device in a concave shape can be provided in which no breaks occur in the capacitor upper electrode. In addition, a semiconductor device can be provided which has a structure capable of using a desired mask to form the low-resistance conductive layer without suffering any influences of the recess resulting from the concave structure, that is, without considering the thickness uniformity or the like of a photoresist film deposited around the recess in forming the low-resistance conductive layer.

Preferably, in the semiconductor device according to one aspect of the present invention, the capacitor upper electrode and the conductive layer have almost the same plan shapes.

With this device, the capacitor upper electrode and the low-resistance conductive layer can be patterned using the same mask. Therefore, unlike the case where they are patterned separately using different masks, the necessity to consider the alignment margin of masks is eliminated, so that a semiconductor device can be provided which can attain a further miniaturization of a cell. Furthermore, the number of times masks are used decreases, so that a semiconductor device having the structure superior in mass productivity can be fabricated.

Preferably, in the semiconductor device according to one aspect of the present invention, the capacitor upper electrode has a fourth recess, and the conductive layer is formed outside the fourth recess.

With this device, a semiconductor device can be provided which has a structure capable of using a desired mask to form the low-resistance conductive layer without suffering any influences of the recess resulting from the concave structure, that is, without considering the thickness uniformity or the like of a photoresist film deposited around the recess in forming the low-resistance conductive layer.

In the semiconductor device according to one aspect of the present invention, the conductive layer is a cell plate line.

A method for fabricating a semiconductor device according to one aspect of the present invention comprises the steps of: forming an insulating film with a recess on a semiconductor substrate; forming a plurality of capacitor elements each of which is made by forming, in the recess, a capacitor lower electrode, a capacitor insulating film of a dielectric film, and a capacitor upper electrode in this order; and forming a conductive layer to cover at least portions of the respective capacitor upper electrodes constituting the plurality of capacitor elements and to extend across the plurality of capacitor elements, the conductive layer having a lower resistance than the capacitor upper electrode.

With the method for fabricating a semiconductor device according to one aspect of the present invention, even though the material of high resistivity such as an oxide is used as an electrode material for the capacitor upper electrode for the purpose of preventing breaks due to stress migration during a thermal treatment, a semiconductor device can be fabricated which can prevent delay of start-up at the time of driving a cell plate to avoid interconnect delay. Consequently, a capacitor element having a cell structure with no interconnect delay caused therein can be realized without depending on the material for the dielectric film and the material for the capacitor upper electrode, so that a semiconductor device capable of being highly integrated can be provided.

As is apparent from the above, with the semiconductor device and its fabrication method according to the present invention, the conductive layer having a lower resistance than the capacitor upper electrode is formed on the top of the capacitor upper electrode. Thereby, even in the case where the material of high resistance is used for the capacitor upper electrode for the reason of the compatibility with the dielectric film, prevention of breaks during a thermal treatment, the gap-filling capability, and the like, a highly-integrated, quickly operable semiconductor device as a dielectric memory device can be provided in which no interconnect delay is caused at the time of driving the cell plate.

BRIEF DESCRIPTION OF THE DRAWINGS

FIGS. 5A to 5D are sectional views showing process steps of a method for fabricating a semiconductor device according to the second embodiment of the present invention.

DETAILED DESCRIPTION OF THE PREFERRED EMBODIMENTS

Hereinafter, embodiments of the present invention will be described with reference to the accompanying drawings.

First Embodiment

The structure of a semiconductor device according to a first embodiment of the present invention will be described below with reference to FIGS. 1A and 1B.

Figure 1A:
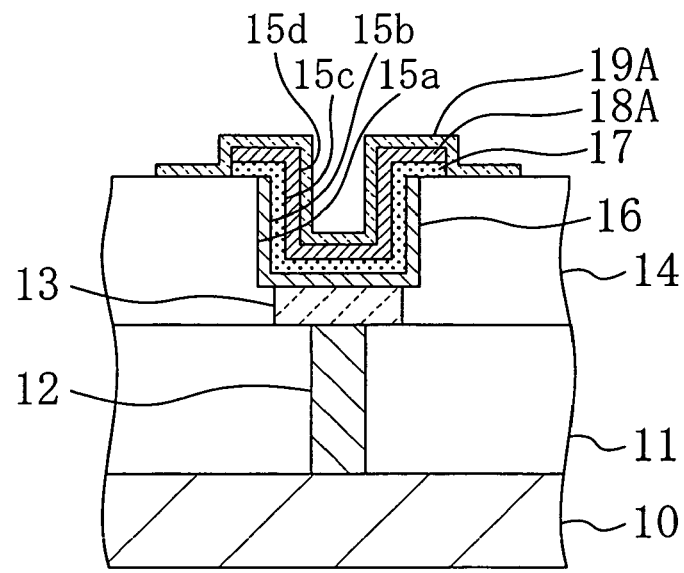
FIG. 1A is a sectional view showing the structure of a semiconductor device according to a first embodiment of the present invention.
Figure 1B:
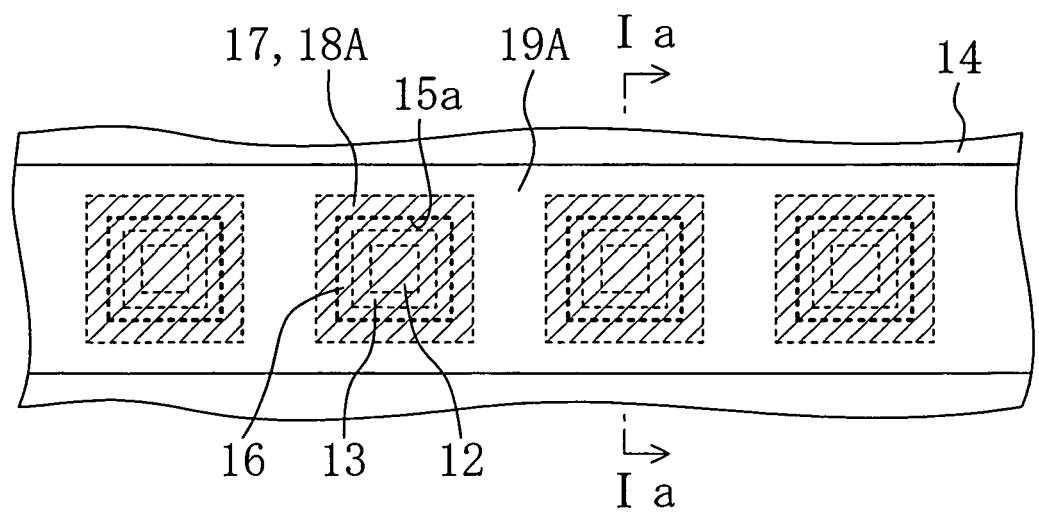
FIG. 1B is a plan view showing the structure of the semiconductor device according to the first embodiment of the present invention.

FIG. 1A shows the structure of the semiconductor device according to the first embodiment of the present invention, and is a sectional view taken along the line Ia-Ia in FIG. 1B. FIG. 1B is a plan view showing the structure of the semiconductor device according to the first embodiment of the present invention.

Referring to FIG. 1A, a first interlayer insulating film 11 of a silicon oxide film having 300 to 800 nm is formed on a semiconductor substrate 10. The first interlayer insulating film 11 is formed with a storage node contact 12 of a tungsten film or a polysilicon film. The storage node contact 12 penetrates the first interlayer insulating film 11 to reach an active region (not shown) of the semiconductor substrate 10. On the first interlayer insulating film 11, an oxygen barrier film 13 is formed which is connected to the upper end of the storage node contact 12, has a thickness of 50 to 300 nm, and contains an iridium film, an iridium oxide film, or the like. The oxygen barrier film 13 serves to prevent oxidation of the storage node contact 12 in crystallizing a dielectric film formed above the oxygen barrier film 13.

On the first interlayer insulating film 11, a second interlayer insulating film 14 is formed which covers the side surface of the oxygen barrier film 13 and includes a first recess 15a. The second interlayer insulating film 14 is made of a silicon oxide film with a thickness of 300 to 800 nm. The first recess 15a is formed to penetrate the second interlayer insulating film 14 and serves as an opening for forming a capacitor element (which will be described later) to be formed above each storage node contact. The first recess 15a has a hole shape. In this embodiment, the hole shape the first recess 15a has indicates an opening formed above each storage node contact 12 as shown in FIG. 1B. This provides a highly-integrated semiconductor device in a concave shape with no breaks occurring in a capacitor upper electrode 18A that will be described below.

On the wall and bottom of the first recess 15a, a capacitor lower electrode 16 of iridium oxide is formed which has a thickness of 5 to 50 nm and includes a second recess 15b. On the top of the capacitor lower electrode 16 and the wall and bottom of the second recess 15b, a capacitor insulating film 17 of an SBT film as a dielectric film is formed which has a thickness of 5 to 100 nm and includes a third recess 15c. On the top of the capacitor insulating film 17 and the wall and bottom of the third recess 15c, a capacitor upper electrode 18A of iridium oxide is formed. As shown above, the reason why the oxide material is used as the electrode material forming the capacitor upper electrode 18A and the capacitor lower electrode 16 is that as compared to the case where an electrode of a precious metal material having a high ductility is employed as the capacitor upper electrode 18A and the capacitor lower electrode 16, the oxide material can prevent breaks due to thermal stress migration occurring intensively in the thinnest portion of the capacitor lower electrode 16 formed in the first recess 15a or in the thinnest portion of the capacitor upper electrode 18A formed in the third recess 15c.

On the top of the second interlayer insulating film 14, the top of the capacitor upper electrode 18A, and the bottom and wall of a fourth recess 15d, a conductive layer 19A (referred hereinafter to as a low-resistance conductive layer 19A) of a platinum film is formed which has a lower resistance than the capacitor upper electrode 18A. In this embodiment, since iridium oxide (112 Ω·m, 0° C.) is used for the capacitor upper electrode 18A, platinum (9.81 Ω·m, 0° C.) having a lower resistance than iridium oxide is employed for the low-resistance conductive layer 19A. If consideration is given to improvement of the adhesions to an interconnect and to an interlayer insulating film ($SiO_2$) to be formed on the top of the low-resistance conductive layer 19A, it is also possible to use iridium (4.7 Ω·m, 0° C.) for the low-resistance conductive layer 19A. Further, in the case where high level of thermal resistance is not demanded of this layer, for example, in the case where ferroelectric-film crystallization is completed before formation of the low-resistance conductive layer 19A, tungsten (4.9 Ω·m, 0° C.), aluminum (2.5 Ω·m, 0° C.), or copper (1.55 Ω·m, 0° C.) may also be used therefor. This makes it possible to attain quicker operation of the memory device.

In the above-described structure of the semiconductor device according to the first embodiment, the capacitor insulating film 17 and the capacitor upper electrode 18A are formed by patterning in the direction in which the cross section is taken (in the vertical direction when viewed in FIG. 1B) using the same mask. Alternatively, in consideration of the adhesion to a film as an underlying layer, the adhesion to a film as an overlying layer, unwanted residues created in the processing, and the like, the capacitor insulating film 17 and the capacitor upper electrode 18A may be formed using different masks.

Although the capacitor upper electrode 18A is formed in the horizontal direction when viewed in FIG. 1B and above each storage node contact 12, it is also acceptable to form it to be shared among the storage node contacts 12. Although the oxygen barrier film 13 is formed on the storage node contact 12, the oxygen barrier film 13 does not necessarily have to be formed depending on the temperature (for example, a low temperature) or the atmosphere (for example, a nitrogen atmosphere) in crystallization of the dielectric film made of, other than the SBT-based material, a PZT-, BLT-, or BST-based metal oxide or the like.

As described above, with the semiconductor device according to the first embodiment of the present invention, the low-resistance conductive layer 19A serving as a cell plate is formed on the top of the capacitor upper electrode 18A. Thus, even though the material of high resistance is chosen as the material for the capacitor upper electrode 18A for the reason of prevention of interconnect breaks during a thermal treatment, a highly-integrated, quickly operable semiconductor device as a dielectric memory device can be provided in which no interconnect delay is caused at the time of driving the cell plate.

Moreover, with the semiconductor device according to the first embodiment of the present invention, even though a thermal treatment at 800° C. is performed for crystallization of the capacitor insulating film 17, breaks of the capacitor upper electrode 18A can be prevented.

Hereinafter, a method for fabricating a semiconductor device according to the first embodiment of the present invention will be described with reference to FIGS. 2A to 2D and FIGS. 3A to 3C.

Figure 2A:
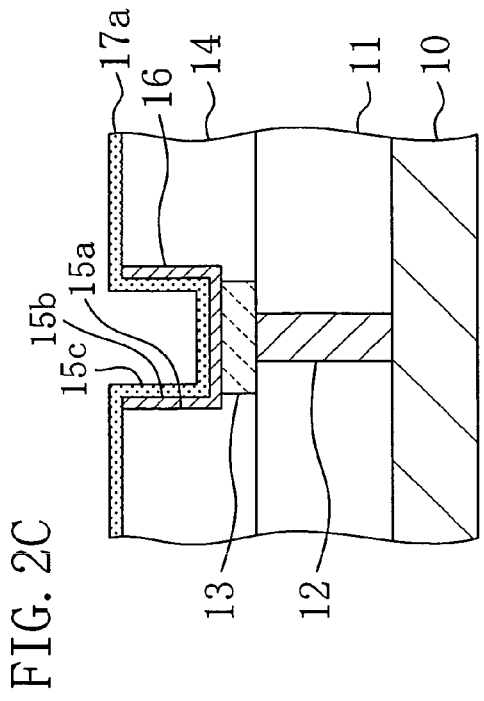
FIGS. 2A to 2D are sectional views showing process steps of a method for fabricating a semiconductor device according to the first embodiment of the present invention.

Referring to FIG. 2A, first, on the semiconductor substrate 10, the first interlayer insulating film 11 of a silicon oxide film is formed which has a thickness of 300 to 800 nm. The first interlayer insulating film 11 is formed with a storage node contact hole exposing the surface of the active region (not shown) of the semiconductor substrate 10, and then the storage node contact hole is filled with a tungsten film or a polysilicon film to form a storage node contact 12 penetrating the first interlayer insulating film 11 to reach the active region of the semiconductor substrate 10.

Thereafter, on the first interlayer insulating film 11, the oxygen barrier film 13 containing an iridium film, an iridium oxide film, or the like is formed which is connected to the upper end of the storage node contact 12 and which has a thickness of 50 to 300 nm. The oxygen barrier film 13 serves to prevent oxidation of the storage node contact 12 during crystallization of a dielectric film formed over the oxygen barrier film 13.

On the first interlayer insulating film 11, the second interlayer insulating film 14 of a silicon oxide film having a thickness of 300 to 800 nm is formed to cover the oxygen barrier film 13.

The formed second interlayer insulating film 14 is patterned using a desired mask to form the first recess 15a penetrating the second interlayer insulating film 14 to provide a way to make an electrical connection to the oxygen barrier film 13 or the storage node contact 12. In the first embodiment, the first recess 15a formed in the second interlayer insulating film 14 has a hole shape. Note that like the above description, the hole shape indicates an opening formed above each storage node contact 12 as shown in FIG. 1B.

Figure 2C:
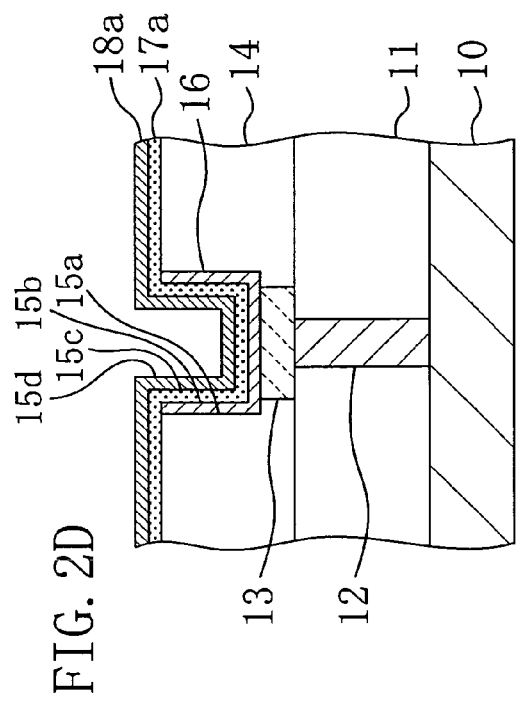
Figure 2B:
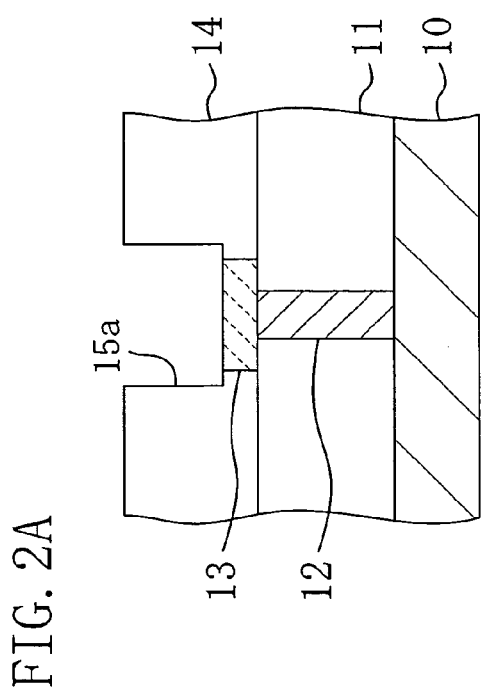

As shown in FIG. 2B, on the top of the second interlayer insulating film 14 and the wall and bottom of the first recess 15a, a first conductive film of iridium oxide is formed which has a thickness of 5 to 50 nm and includes a second recess 15b. Thereafter, in order to electrically separate at least the storage node contacts 12B from each other, the first conductive film is subjected to conduct patterning with a desired mask, a plating method, a combination of a sputtering method and a CMP method, or a self-alignment technique such as a sidewall formation method. Thereby, the capacitor lower electrode 16 with the second recess 15b is formed.

As shown in FIG. 2C, using a CVD method, an SBT film 17a serving as a dielectric film is formed on the top of the second interlayer insulating film 14, the top of the capacitor lower electrode 16, and the wall and bottom of the second recess 15b. The SBT film 17a includes the third recess 15c, and has a thickness of 5 to 100 nm.

Figure 2D:
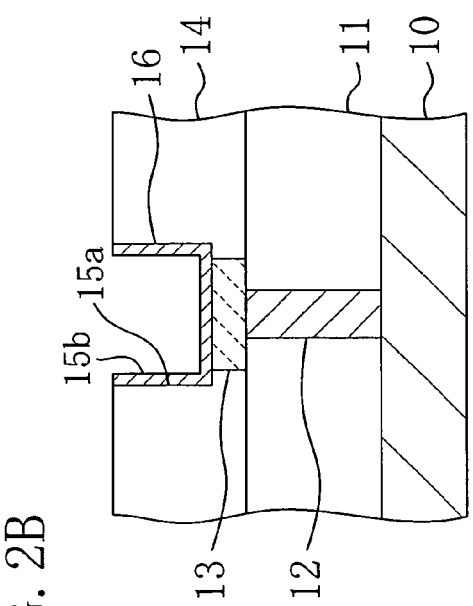

As shown in FIG. 2D, a second conductive film 18a of iridium oxide is formed on the top of the SBT film 17a and the wall and bottom of the third recess 15c. The second conductive film 18a includes the fourth recess 15d, and has a thickness of 50 to 300 nm.

Figure 3A:
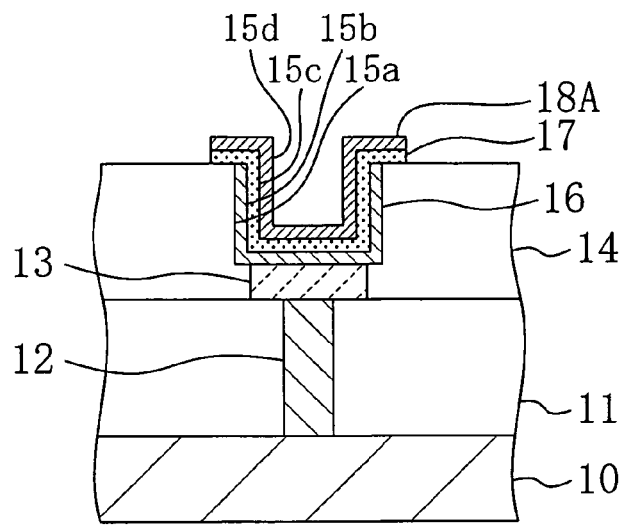
FIGS. 3A to 3C are sectional views showing process steps of the method for fabricating a semiconductor device according to the first embodiment of the present invention.

As shown in FIG. 3A, the second conductive film 18a and the SBT film 17a are patterned using a desired mask to form the capacitor upper electrode 18A of the second conductive film 18a and the capacitor insulating film 17 of the SBT film 17a.

In this formation method, description has been made of the case where in forming the capacitor insulating film 17 and the capacitor upper electrode 18, patterning thereof is conducted using the same mask. However, as mentioned previously, it is also acceptable not to use the same mask in consideration of the adhesion to a film as an underlying layer, the adhesion to a film as an overlying layer, unwanted residues created in the processing, and the like.

Although, like the above description, the capacitor upper electrode 18 is formed above each storage node contact 12, it is also acceptable to form it to be shared among the storage node contacts 12. Although the oxygen barrier film 13 is formed on the storage node contact 12, the oxygen barrier film 13 does not necessarily have to be formed depending on the temperature (for example, a low temperature) or the atmosphere (for example, a nitrogen atmosphere) in crystallization of the dielectric film made of, other than the SBT-based material described above, a PZT-, BLT-, or BST-based metal oxide or the like.

Figure 3B:
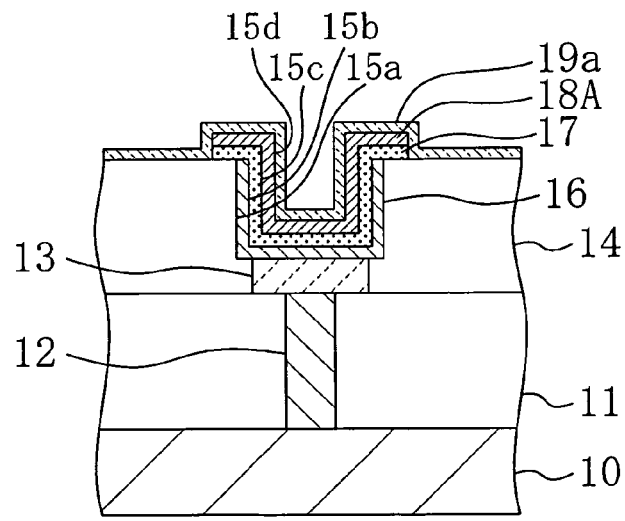

Thereafter, as shown in FIG. 3B, a third conductive film 19a of platinum is formed on the top of the second interlayer insulating film 14, the top of the capacitor upper electrode 18A, and the wall and bottom of the fourth recess 15d.

Figure 3C:
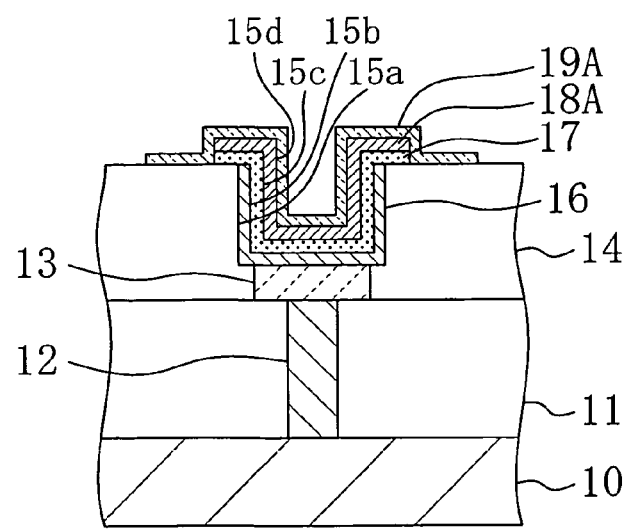

As shown in FIG. 3C, the third conductive film 19a is patterned using a desired mask to form a low-resistance conductive layer 19 of the third conductive film 19a.

As described above, with the method for fabricating a semiconductor device according to the first embodiment of the present invention, the low-resistance conductive layer 19A serving as a cell plate is formed on the top of the capacitor upper electrode 18A. Thus, even though the material of high resistance is chosen as the material for the capacitor upper electrode 18A for the reason of prevention of breaks during a thermal treatment, a highly-integrated, quickly operable semiconductor device as a dielectric memory device can be provided in which no interconnect delay is caused at the time of driving the cell plate.

Note that the structure may also be employed in which the low-resistance conductive layer 19A is not used as a cell plate and the top of the low-resistance conductive layer 19A is provided with a cell plate made of a conductive material with a lower resistance.

Second Embodiment

Hereinafter, the structure of a semiconductor device according to a second embodiment of the present invention will be described with reference to FIGS. 4A and 4B.

Figure 4A:
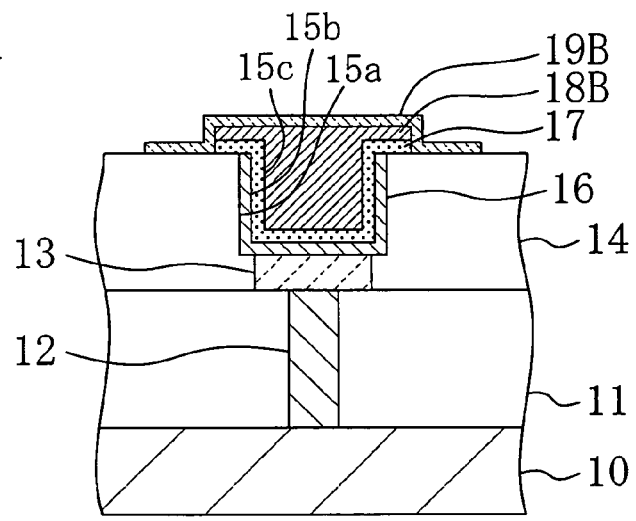
FIG. 4A is a sectional view showing the structure of a semiconductor device according to a second embodiment of the present invention.
Figure 4B:
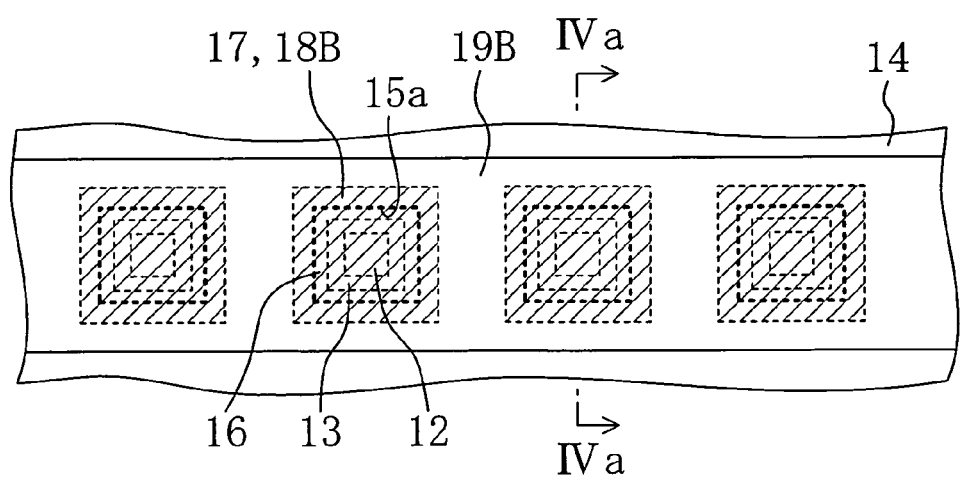
FIG. 4B is a plan view showing the structure of the semiconductor device according to the second embodiment of the present invention.

FIG. 4A shows the structure of the semiconductor device according to the second embodiment of the present invention, and is a sectional view taken along the line IVa-IVa in FIG. 4B. FIG. 4B is a plan view showing the structure of the semiconductor device according to the second embodiment of the present invention.

A point of difference between the structure of the semiconductor device according to the second embodiment shown in FIGS. 4A and 4B and the structure of the semiconductor device according to the first embodiment shown in FIGS. 1A and 1B is that as shown in FIG. 4A, a capacitor upper electrode 18B is embedded to fully fill the inside of the third recess 15c. In the second embodiment, as the electrode material used for the capacitor upper electrode 18B, the material that is superior in the gap-filling capability is preferably employed, so that a platinum film is employed which can fully fill the inside of the third recess 15c by a plating technique. Thus, the capacitor upper electrode 18B is made by fully filling the inside of the third recess 15c with a platinum film, which basically prevents breaks due to thermal stress migration occurring intensively in the thinnest portion of the electrode formed in the recess.

Moreover, on the top of the capacitor upper electrode 18B, a conductive layer 19B of iridium (referred hereinafter to as a low-resistance conductive layer 19B) is formed which has a lower resistance than the capacitor upper electrode 18B. Unlike the capacitor upper electrode 18A of the first embodiment having the fourth recess 15d, the capacitor upper electrode 18B in the second embodiment has no recess. Therefore, when the low-resistance conductive layer 19B is formed by patterning a conductive layer of low resistance (a third conductive film 19b that will be described later) formed on the capacitor upper electrode 18B, the influence of the concave structure of the device is eliminated. Specifically, for the first embodiment, thickness unevenness of a photoresist film deposited in forming the low-resistance conductive layer 19A arises around the fourth recess 15d, which degrades the accuracy of dimension of the photoresist pattern. On the other hand, for the second embodiment, since no recess is formed in the capacitor upper electrode 18B as mentioned above, the low-resistance conductive layer 19B can be formed using a desired mask without considering degradation in the accuracy of dimension of the photoresist pattern.

As described above, with the semiconductor device according to the second embodiment of the present invention, the capacitor upper electrode 18B is fully embedded within the third recess 15c, which basically prevents the occurrence of breaks during a thermal treatment. Moreover, even though a thermal treatment at 800° C. is performed for crystallization of the capacitor insulating film 17, such a structure can certainly prevent the occurrence of breaks in the capacitor upper electrode 18B. Furthermore, the low-resistance conductive layer 19B is formed on the top of the capacitor upper electrode 18B. Thus, even though the material of high resistance is chosen as an electrode material forming the capacitor upper electrode 18B in consideration of the gap-filling capability of that electrode material like the first embodiment, a highly-integrated, quickly operable semiconductor device as a dielectric memory device can be provided in which no interconnect delay is caused at the time of driving the cell plate.

Hereinafter, a method for fabricating a semiconductor device according to the second embodiment of the present invention will be described with reference to FIGS. 5A to 5D and 6A to 6C.

First, the steps shown in FIGS. 5A to 5C are identical to the steps previously described using FIGS. 2A to 2C.

Next, as shown in FIG. 5D, using a plating technique or the like, a second conductive film 18b of a platinum film having a thickness of 50 to 300 nm is formed on the SBT film 17a to fill the third recess 15c.

Figure 6A:
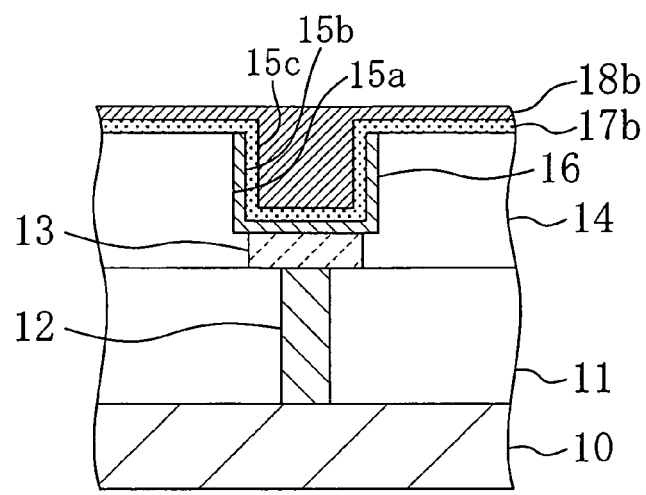
FIGS. 6A to 6C are sectional views showing process steps of the method for fabricating a semiconductor device according to the second embodiment of the present invention.

As shown in FIG. 6A, etch back or CMP is conducted to reduce the thickness of the second conductive film 18b to a desired value.

Figure 6B:
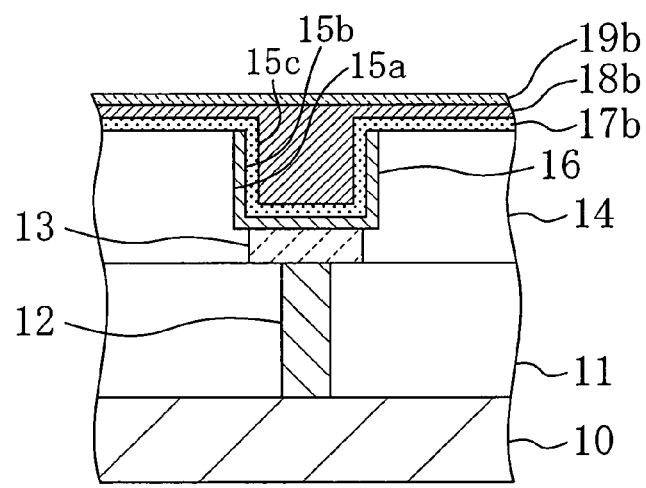

As shown in FIG. 6B, the third conductive film 19b of iridium is formed on the second conductive film 18b.

Figure 6C:
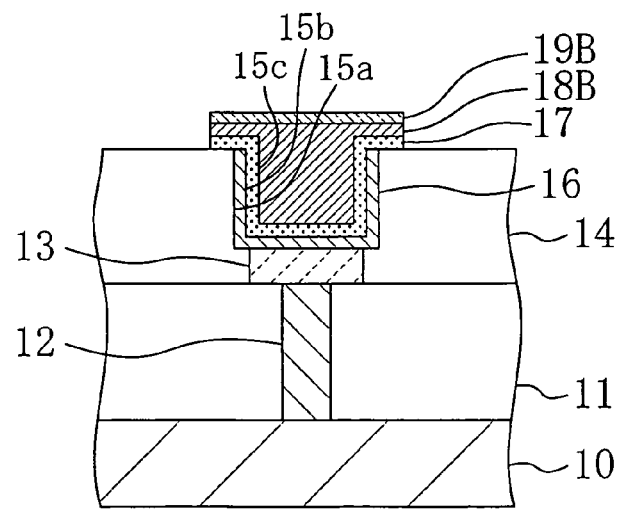

As shown in FIG. 6C, the third conductive film 19b, the second conductive film 18b, and the SBT film 17a are patterned using a desired mask to form the low-resistance conductive layer 19B of the third conductive film 19b, the capacitor upper electrode 18B of the second conductive film 18b, and the capacitor insulating film 17 of the SBT film 17a.

In the second embodiment, description has been made of the case where formation of the capacitor insulating film 17, the capacitor upper electrode 18B, and the low-resistance conductive layer 19B is conducted by patterning with the same mask. Alternatively, in consideration of the adhesion to a film as an underlying layer, the adhesion to a film as an overlying layer, unwanted residues created in the processing, and the like, the same mask does not necessarily have to be used for this formation.

Although, like the first embodiment, the capacitor upper electrode 18B is formed above each storage node contact 12, it is also acceptable to form it to be shared among the storage node contacts 12. Although the oxygen barrier film 13 is formed on the storage node contact 12, the oxygen barrier film 13 does not necessarily have to be formed depending on the temperature (for example, a low temperature) or the atmosphere (for example, a nitrogen atmosphere) in crystallization of the dielectric film made of, other than the SBT-based material mentioned above, a PZT-, BLT-, or BST-based metal oxide or the like.

As described above, with the method for fabricating a semiconductor device according to the second embodiment of the present invention, the low-resistance conductive layer 19B is formed on the top of the capacitor upper electrode 18B like the first embodiment. Therefore, a semiconductor device as a dielectric memory device can be provided which can carry out quick operation with no interconnect delay in the cell plate. Moreover, the capacitor upper electrode 18B is buried to fill the inside of the third recess 15c. This avoids the situation of local concentration of stress to reduce the influence of thermal stress migration, which basically prevents the occurrence of breaks in the capacitor upper electrode 18B. Accordingly, a capacitor element with the cell structure capable of preventing breaks in the capacitor upper electrode 18B can be realized without depending on the material for the capacitor insulating film 17 and the material for the capacitor upper electrode 18B, so that a semiconductor device capable of being highly integrated can be provided.

Third Embodiment

The structure of a semiconductor device according to a third embodiment of the present invention will be described below with reference to FIGS. 7A and 7B.

Figure 7A:
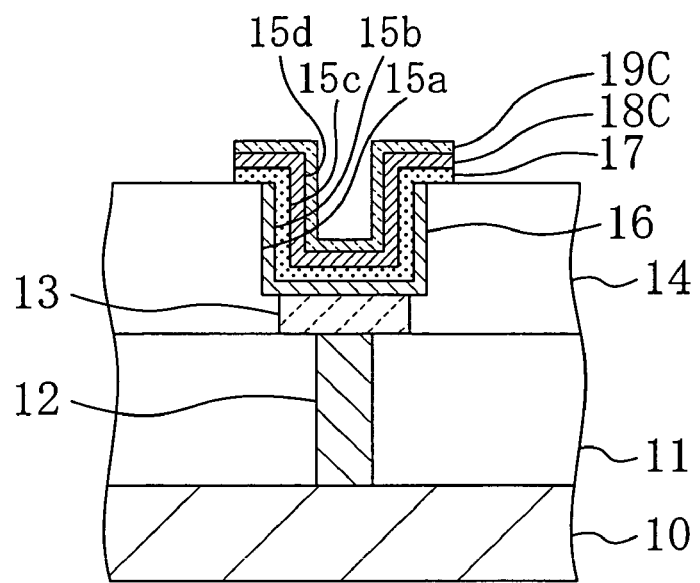
FIG. 7A is a sectional view showing the structure of a semiconductor device according to a third embodiment of the present invention.
Figure 7B:
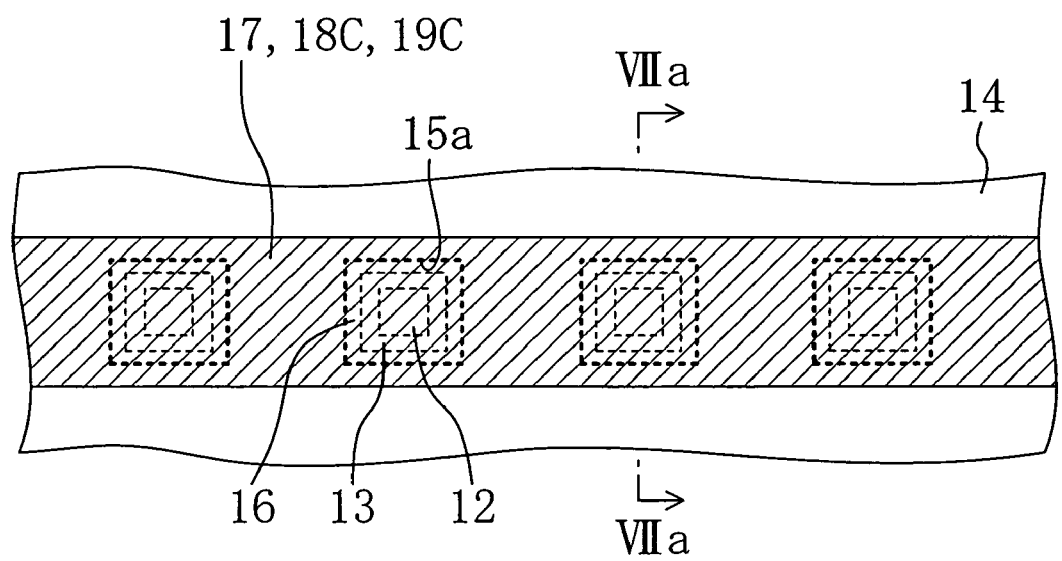
FIG. 7B is a plan view showing the structure of the semiconductor device according to the third embodiment of the present invention.

FIG. 7A shows the structure of the semiconductor device according to the third embodiment of the present invention, and is a sectional view taken along the line VIIa-VIIa in FIG. 7B. FIG. 7B is a plan view showing the structure of the semiconductor device according to the third embodiment of the present invention.

A point of difference between the structure of the semiconductor device according to the third embodiment shown in FIGS. 7A and 7B and the structure of the semiconductor device according to the first embodiment shown in FIGS. 1A and 1B is that as shown in FIGS. 7A and 7B, a capacitor upper electrode 18C and a low-resistance conductive layer 19C of the third embodiment have almost the same shapes.

On the top of the capacitor insulating film 17 and the wall and bottom of the third recess 15c, the capacitor upper electrode 18C is formed which is made of iridium oxide. On the top of the capacitor upper electrode 18C and the wall and bottom of the fourth recess 15d, the low-resistance conductive layer 19C of a platinum film is formed which has a lower resistance than the capacitor upper electrode 18C.

In the structure of the semiconductor device according to the third embodiment of the present invention described above, the capacitor insulating film 17, the capacitor upper electrode 18C, and the low-resistance conductive layer 19C are formed by patterning using the same mask, that is, formed to be shared among the storage node contacts 12.

Thus, patterning using the same mask eliminates the necessity to consider the alignment margin of masks unlike the case where different masks are used for patterning. Therefore, a further miniaturization of a cell can be attained. Furthermore, since the number of times masks are used decreases, the structure of the third embodiment is superior in mass productivity.

As shown above, with the semiconductor device according to the third embodiment of the present invention, the low-resistance conductive layer 19C is formed on the top of the capacitor upper electrode 18C. Thus, even though the material of high resistance is chosen as the material of the capacitor upper electrode 18C for the reason of prevention of breaks during a thermal treatment or the like as in the cases of the first and second embodiments, a highly-integrated, quickly operable semiconductor device as a dielectric memory device can be provided in which no interconnect delay is caused at the time of driving the cell plate. Moreover, since the capacitor insulating film 17, the capacitor upper electrode 18C, and the low-resistance conductive layer 19C have almost the same plan shapes, a semiconductor device that excels in miniaturization and mass productivity can be provided.

Fourth Embodiment

Hereinafter, the structure of a semiconductor device according to a fourth embodiment of the present invention will be described with reference to FIGS. 8A and 8B.

Figure 8A:
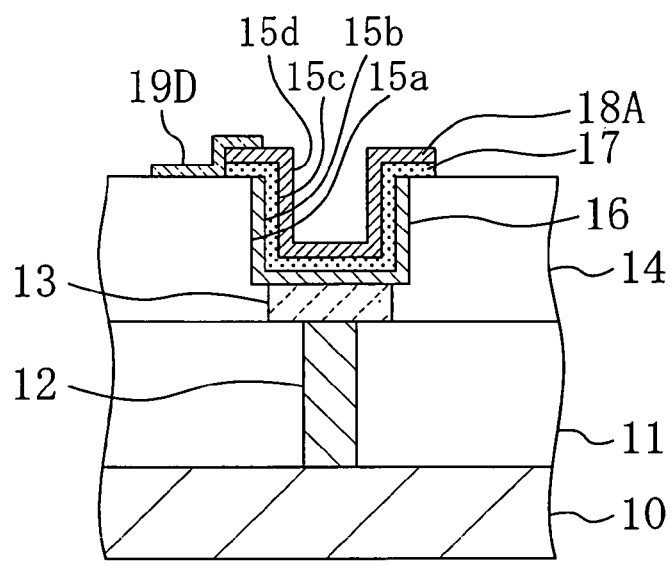
FIG. 8A is a sectional view showing the structure of a semiconductor device according to a fourth embodiment of the present invention.
Figure 8B:
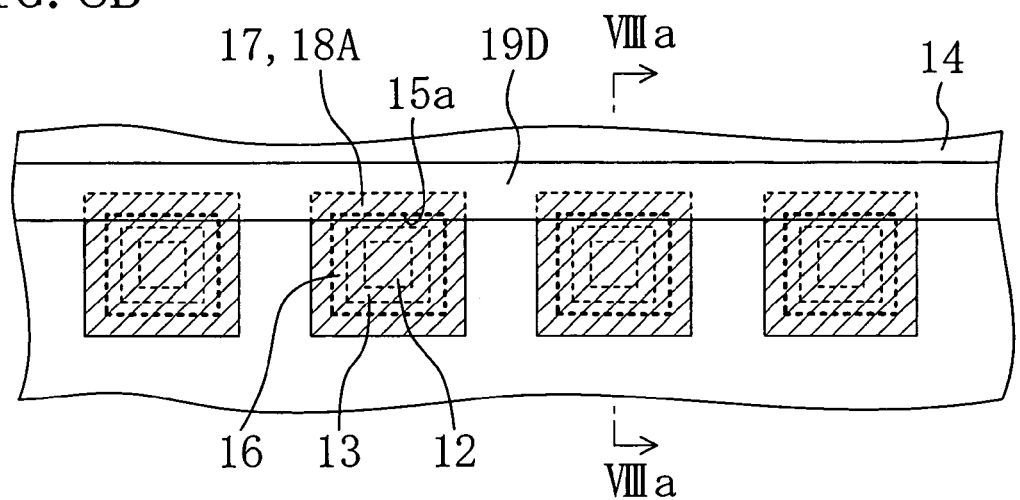
FIG. 8B is a plan view showing the structure of the semiconductor device according to the fourth embodiment of the present invention.

FIG. 8A shows the structure of the semiconductor device according to the fourth embodiment of the present invention, and is a sectional view taken along the line VIIIa-VIIIa in FIG. 8B. FIG. 8B is a plan view showing the structure of the semiconductor device according to the fourth embodiment of the present invention.

A point of difference between the structure of the semiconductor device according to the fourth embodiment shown in FIGS. 8A and 8B and the structure of the semiconductor device according to the first embodiment shown in FIGS. 1A and 1B is that as shown in FIGS. 8A and 8B, a low-resistance conductive layer 19D in the fourth embodiment is formed outside the fourth recess 15d of the capacitor upper electrode 18A.

To be more specific, on the top of the capacitor insulating film 17 and the wall and bottom of the third recess 15c, the capacitor upper electrode 18A of iridium oxide is formed which has the fourth recess 15d. On the top of the second interlayer insulating film 14 and part of the top flat portion of the capacitor upper electrode 18A (with the inside of the fourth recess 15d not covered therewith), a conductive layer 19D of a platinum film (referred hereinafter to as a low-resistance conductive layer 19D) is formed which has a lower resistance than the capacitor upper electrode 18A. Note that it is also acceptable that the capacitor upper electrode is formed to fill the third recess 15c like the second embodiment.

Such a structure eliminates the influence of the fourth recess 15d that has the shape of a step. That is to say, such a structure eliminates consideration of the thickness uniformity or the like of a photoresist film deposited around the fourth recess 15d in forming the low-resistance conductive layer 19D, so that formation of the low-resistance conductive layer 19D using a desired mask is enabled.

Moreover, since the low-resistance conductive layer 19D is formed on the top flat portion of the second interlayer insulating film 14, a cell plate with a stable resistance can be formed with no influence of level difference of the underlying layer.

As described above, with the semiconductor device according to the fourth embodiment of the present invention, the low-resistance conductive layer 19D is formed on part of the top portion of the capacitor upper electrode 18A. Thus, even though the material of high resistance is chosen as the material for the capacitor upper electrode 18A for the reason of prevention of breaks during a thermal treatment or the like as in the cases of the first to third embodiments, a highly-integrated, quickly operable semiconductor device as a dielectric memory device can be provided in which no interconnect delay is caused at the time of driving the cell plate.

Herein, FIGS. 9A to 9F show views of respective plan arrangements of the capacitor upper electrodes 18 (18A, 18B, and 18C) and the low-resistance conductive layers 19 (19A to 19D) of the semiconductor devices according to the first to fourth embodiments described above. In particular, these figures show possible arrangement variations in the case where a plurality of capacitor upper electrodes 18 are provided.

Figure 9C:
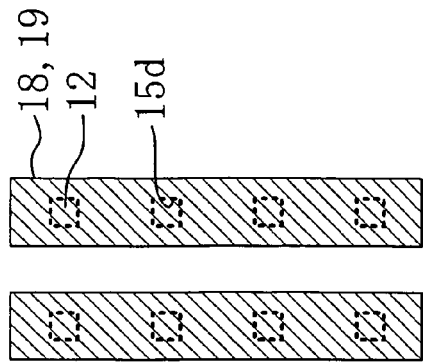
FIGS. 9A to 9F are views showing respective plan arrangements of capacitor upper electrodes and low-resistance conductive layers in the structures of the semiconductor devices according to the first to fourth embodiments of the present invention.
Figure 9F:
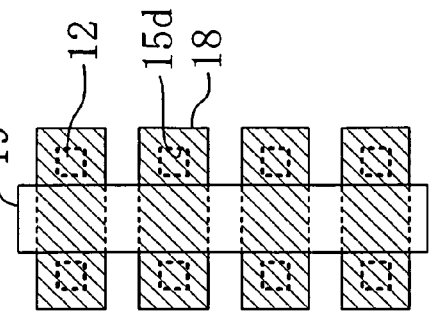
Figure 9B:
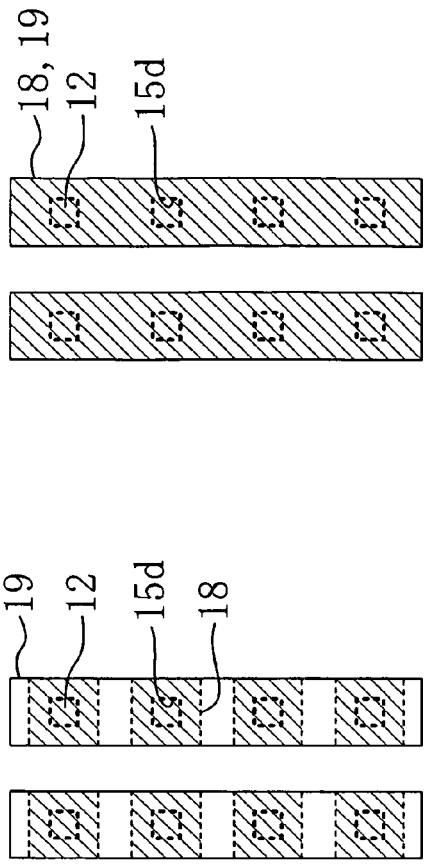
Figure 9E:
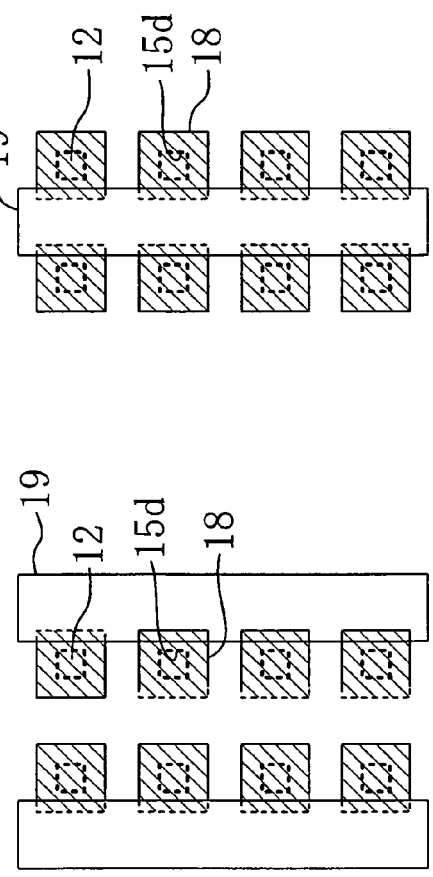
Figure 9A:
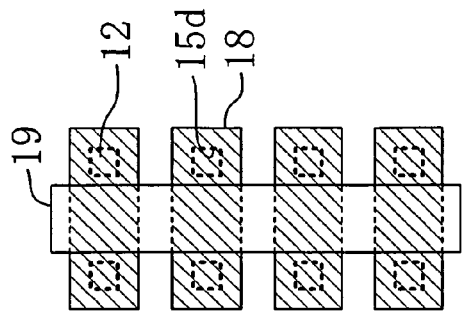

FIG. 9A shows the structure in which a plurality of capacitor upper electrodes 18 are formed above the storage node contacts 12, respectively, and the low-resistance conductive layer 19 is formed to entirely cover the plurality of capacitor upper electrodes 18. The structure shown in FIG. 9A is suitable for setting of all or some of the cell plates at the same potential. Note that this structure is applicable to the first and second embodiments.

FIG. 9B shows the structure in which a plurality of capacitor upper electrodes 18 are formed above the storage node contacts 12, respectively, and the low-resistance conductive layer 19 is formed to cover each row of the plurality of capacitor upper electrodes 18. The structure shown in FIG. 9B is suitable for setting of the cell plates aligned in the row direction at the same potential. Note that this structure is applicable to the first and second embodiments.

FIG. 9C shows the structure in which the capacitor upper electrode 18 and the low-resistance conductive layer 19 are formed to be shared among a plurality of storage node contacts 12 and to have the same shape. The structure shown in FIG. 9C is suitable for the case where the number of times masks are used is reduced and the cell plates aligned in the row direction are set at the same potential. Note that this structure corresponds to the structure of the third embodiment.

Figure 9D:
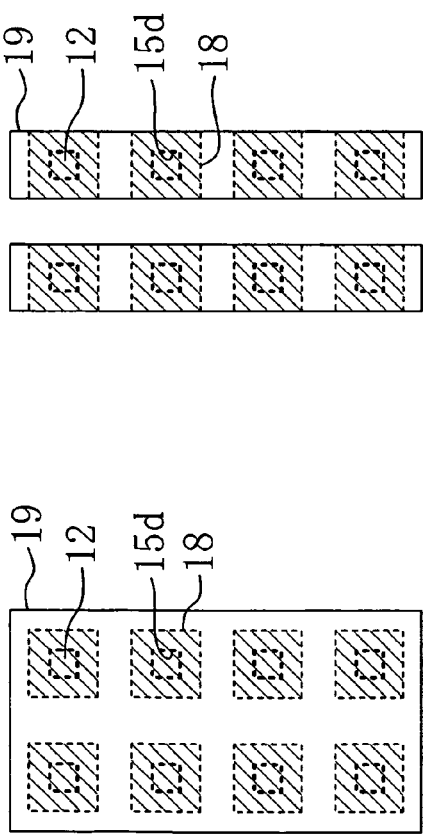
Figure 10:
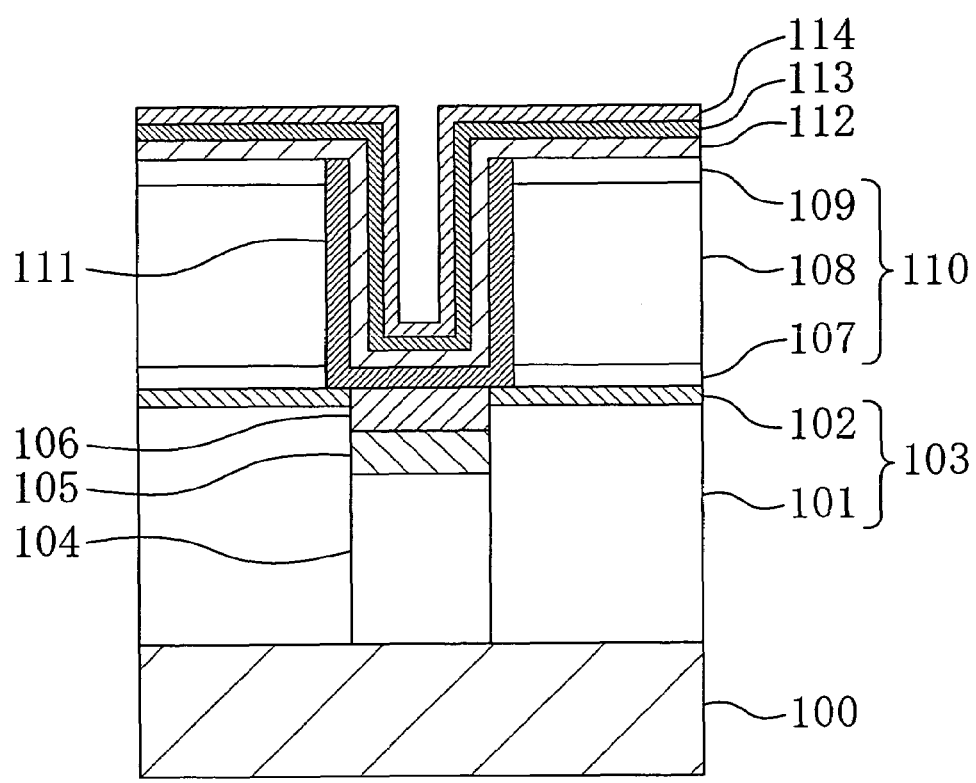
FIG. 10 is a sectional view showing the structure of a conventional semiconductor device.

The structures shown in FIGS. 9D to 9F show variations of the fourth embodiment. FIG. 9D shows the structure in which the low-resistance conductive layer 19 is formed on the capacitor upper electrodes 18 and outside the fourth recesses 15d. This structure is suitable for setting of the cell plates aligned in the row direction at the same potential. FIG. 9E shows the structure in which the low-resistance conductive layer 19 is formed outside the fourth recesses 15d of the capacitor upper electrodes 18 to connect adjacent rows of the capacitor upper electrodes 18 for shared use. Thus, this structure is suitable for setting the cell plates aligned in the row direction at the same potential. Although this structure is identical to that in FIG. 9A in terms of potential, this structure can be constructed only by providing the low-resistance conductive layer between the adjacent rows to miniaturize the cell. FIG. 9F shows the structure in which the area of the low-resistance conductive layer 19 in contact with each capacitor upper electrode 18 is increased as compared with the structure in FIG. 9D. This structure can reduce the contact resistance to prevent interconnect delay more effectively.

Accordingly, the semiconductor device and its fabrication method of the present invention can prevent interconnect delay of the cell plate by forming the low-resistance conductive layer on the capacitor upper electrode. Therefore, the semiconductor device and its fabrication method are useful for ferroelectric memory devices or high dielectric memory devices which have three-dimensionally stacked structures and require quick operations, and for fabrication methods of such devices.

What is claimed is:

1. A semiconductor device comprising:
   an insulating film formed over a semiconductor substrate and having a first recess;
   a plurality of capacitor elements each of which is composed of a capacitor lower electrode, a capacitor insulating film, and a capacitor upper electrode, the capacitor lower electrode being formed on wall and bottom portions of the first recess and having a second recess, the capacitor insulating film of a dielectric film being formed on wall and bottom portions of the second recess and having a third recess, the capacitor upper electrode being formed on wall and bottom portions of the third recess; and
   a conductive layer which is formed to cover at least portions of the respective capacitor upper electrodes constituting the plurality of capacitor elements and to extend across the plurality of capacitor elements and which has a lower resistance than the capacitor upper electrode.

2. The device of claim 1,
   wherein the capacitor upper electrode is formed to be embedded within the third recess.

3. The device of claim 1,
   wherein the capacitor upper electrode and the conductive layer have almost the same plan shapes.

4. The device of claim 1,
   wherein the capacitor upper electrode has a fourth recess, and
   the conductive layer is formed outside the fourth recess.

5. The device of claim 1,
   wherein the conductive layer is a cell plate line.

* * * * *